(12) United States Patent
Riedl et al.

(10) Patent No.: US 11,652,012 B2
(45) Date of Patent: May 16, 2023

(54) INORGANIC ENCAPSULANT FOR ELECTRONIC COMPONENT WITH ADHESION PROMOTER

(71) Applicant: Infineon Technologies AG, Neubiberg (DE)

(72) Inventors: Edmund Riedl, Wald (DE); Steffen Jordan, Pielenhofen (DE); Stefan Miethaner, Regensburg (DE); Stefan Schwab, Vienna (AT)

(73) Assignee: Infineon Technologies AG, Neubiberg (DE)

( * ) Notice: Subject to any disclaimer, the term of this patent is extended or adjusted under 35 U.S.C. 154(b) by 186 days.

(21) Appl. No.: 16/913,188

(22) Filed: Jun. 26, 2020

(65) Prior Publication Data

US 2020/0411400 A1    Dec. 31, 2020

(30) Foreign Application Priority Data

Jun. 28, 2019 (DE) .......................... 102019117534.8

(51) Int. Cl.
*H01L 23/29* (2006.01)
*H01L 21/56* (2006.01)

(52) U.S. Cl.
CPC .............. *H01L 23/29* (2013.01); *H01L 21/56* (2013.01)

(58) Field of Classification Search
CPC ....................................................... H01L 23/29
USPC ........................................................ 257/789
See application file for complete search history.

(56) References Cited

U.S. PATENT DOCUMENTS

| | | | |
|---|---|---|---|
| 2005/0133938 A1* | 6/2005 | Lim | H01L 24/19 438/126 |
| 2006/0154103 A1 | 7/2006 | Riedl et al. | |
| 2007/0145606 A1 | 6/2007 | Mahler et al. | |
| 2009/0065912 A1 | 3/2009 | Riedl et al. | |
| 2015/0034858 A1 | 2/2015 | Raman et al. | |
| 2016/0079564 A1* | 3/2016 | Shim | H01L 27/3246 257/40 |
| 2016/0260648 A1 | 9/2016 | Eisele | |
| 2017/0166784 A1* | 6/2017 | Hedrick | H01L 25/0657 |
| 2018/0082921 A1* | 3/2018 | Grassmann | H01L 23/49575 |
| 2018/0265758 A1 | 9/2018 | Kim et al. | |
| 2019/0206851 A1* | 7/2019 | Takeya | H05B 33/12 |
| 2019/0378786 A1* | 12/2019 | Hejtmann | H01L 24/19 |

FOREIGN PATENT DOCUMENTS

| | | | | |
|---|---|---|---|---|
| DE | 102004047510 A1 | 4/2006 | | |
| DE | 102014112406 A1 | 3/2016 | | |
| WO | WO-2014210613 A1 * | 12/2014 | ........... | C23C 16/308 |
| WO | 2018114411 A1 | 6/2018 | | |

* cited by examiner

*Primary Examiner* — Ajay Arora
(74) *Attorney, Agent, or Firm* — Murphy, Bilak & Homiller, PLLC

(57) ABSTRACT

A package includes an electronic component, an inorganic encapsulant encapsulating at least part of the electronic component, and an adhesion promoter between at least part of the electronic component and the encapsulant.

17 Claims, 5 Drawing Sheets

INORGANIC ENCAPSULANT FOR ELECTRONIC COMPONENT WITH ADHESION PROMOTER

TECHNICAL FIELD

Various embodiments relate generally to a package, a method of manufacturing a package, and a method of use.

BACKGROUND

A conventional package may comprise an electronic component mounted on a chip carrier such as a leadframe, may be electrically connected by a bond wire extending from the chip to the chip carrier, and may be molded using a mold compound as an encapsulant.

SUMMARY

There may be a need to encapsulate devices such as electronic components with a high reliability.

According to an exemplary embodiment, a package is provided which comprises an electronic component, an inorganic encapsulant encapsulating at least part of the electronic component, and an adhesion promoter between at least part of the electronic component and the encapsulant.

According to another exemplary embodiment, a method of manufacturing a package is provided, wherein the method comprises forming an adhesion promoter on at least part of an electronic component, and at least partially encapsulating the electronic component with an inorganic encapsulant with the adhesion promoter in between (i.e. between at least part of the electronic component and the encapsulant).

According to another exemplary embodiment, an inorganic encapsulant is used for at least partially encapsulating a device with an adhesion promoter between at least part of the device and the encapsulant.

According to an exemplary embodiment, the use of inorganic encapsulation material for electronic components (such as semiconductor chips) has turned out as technically highly advantageous, when an adhesion promoter is interposed between the electronic component and the inorganic encapsulant. Such an inorganic encapsulant may provide for a reliable electric insulation, may have proper thermal properties and may provide for a mechanically robust surrounding of the electronic component. By covering at least part of the electronic component to be encapsulated with an adhesion promoter, the mechanical stability of the package may be further increased and any tendency of delamination between encapsulant and electronic component may be strongly suppressed or even eliminated.

In the following, further exemplary embodiments of the methods and the package will be explained.

In the context of the present application, the term "package" may particularly denote an electronic device comprising one or more electronic components packaged using an encapsulant. Optionally, also a carrier for the electronic component and/or one or more electrically conductive contact elements (such as bond wires or clips) may be implemented in a package.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). However, in other embodiments, the encapsulated device may also be of different type, such as a mechatronic member, in particular a mechanical switch, etc.

In the context of the present application, the term "adhesion promoter" may particularly denote any material and/or measure enhancing adhesion between the electronic component and the encapsulant. More specifically, such an adhesion promoter (or coupling agent or bonding agent) may act as an interface between the inorganic encapsulant and the partially or entirely encapsulated electronic component or other device to enhance adhesion between these two materials. Since such inorganic encapsulant material on the one hand and the (in particular metallic and/or semiconducting) encapsulated electronic component or other device on the other hand may be different concerning their physical and/or chemical properties (for instance chemical reactivity, surface properties, etc.), forming a direct strong adhesive bond between these two materials may be difficult. An adhesion promoter may however act as a, in a chemical sense, two-terminal interface providing a first connection terminal with the encapsulant and providing a second connection terminal with the encapsulated electronic component or other device to chemically and physically connect these dissimilar materials into a strong bond structure (see also FIG. 2). More specifically, an adhesion promoter may act as a two-terminal, three-terminal or multi-terminal organic molecule, such as aminosilanes that undergo prepolymerisation (oligomerisation) prior to application in their solution, for instance via condensation reactions. In order to promote the adhesion between the one or more electronic components/devices and the inorganic encapsulant, the mentioned adhesion promoter may significantly promote mechanical interconnection between the mentioned constituents, so that the mechanical and electrical reliability can be further improved.

In the context of the present application, the term "inorganic encapsulant" may particularly denote a material encapsulating the at least one electronic component/device and comprising or consisting of inorganic material. An inorganic material may be a chemical compound that lacks C—H bonds, i.e. a compound that is not an organic compound.

A gist of an exemplary embodiment is the use of an inorganic ceramic-based encapsulation material for semiconductor devices or other electronic components. As examples for such an inorganic ceramic-based encapsulation material, reference is made in particular to the ceramic formulations or materials described in Table 1.

Advantageously, a morphological adhesion promoter may be combined with an inorganic encapsulation material (for example concrete) that offers the possibility to build highly reliable devices:

a) In more specific embodiments, self-passivating, only self-passivating metals or highly stable metal oxides involved for hermetic sealing of chips or other electronic components may be used.

b) Advantageously, a corresponding package may be high temperature stable up to 300° C. or higher, as there is no organic material that may undergo decomposition.

c) Preferably, a porous morphological adhesion promotor, which compensates a coefficient of thermal expansion (CTE)-mismatch, may be implemented (compare also FIG. 14 and FIG. 15). In particular a low-CTE ceramic encapsulant combined with such a morphological adhesion promoter may lead to a significant stress reduction or even stress minimization in the package.

d) Advantageously, strong package interfaces may be achieved through mechanical interlocking dendrites or the like, so that preferably no delamination of the ceramic encapsulation occurs during the entire lifetime of the package.

Also advantageously, a material as described herein may be used, wherein a corresponding adhesion promoter comprises or consists of a roughened or structured surface or has a porous or dendrite-like structure. Examples are given in Table 3. A corresponding adhesion layer may also act advantageously as a CTE adaption layer.

Further preferred is the use of materials as described herein with an additional layer adjacent to the encapsulation material, which can for example comprise or consist of polymers, gels, inorganic layers, organic layers or gases (for example air, nitrogen).

The use of III/IV semiconductors (for instance GaN), of III/V semiconductors, and/or of wide band gap semiconductors, which may allow higher junction temperature Tj as well as the requirements for longer life time from automotive for self-driving cars lead to the demand of packages that are reliable at higher temperatures and achieve longer lifetime. Since current packaging solutions are either not applicable for higher temperatures (for example epoxy systems may be limited to about 200° C.) and/or involve an excessive effort, the need of alternative package solutions is emerging. Exemplary embodiments provide a solution for this conventional shortcoming.

In an embodiment, the encapsulant is a ceramic-based encapsulant. In the context of the present application, the term "ceramic" may particularly denote a technical ceramic. Such technical ceramics may have the properties according to ENV 12212 (in the most recent version at the priority date of the present application). In particular, the ceramic may be a highly developed, high-performance applicable ceramic material, which may be mainly non-metallic and inorganic and may have certain functional properties. In particular, the term "ceramic" in the scope of this disclosure may encompass all listed ceramic types of ENV 12212: C 111, C 112, C 120, C 130, C 140, C 210, C 221, C 221, C 230, C 240, C 250, C 410, C 420, C 430, C 440; C 510, C 511, C 512, C 520, C 530, C 610, C 620, C 310; C 320, C 330, C 331, C 340, C 350, C 351, C 780, C 786, C 795, C 799, RBAO (denoting a term according to DIN ENV 14 242), C 810, C 820, MgO (denoting a term according to DIN ENV 14 242), PSZ (denoting a term according to DIN ENV 14 242), FSZ (denoting a term according to DIN ENV 14 242), TZP (denoting a term according to DIN ENV 14 242), ATI (denoting a term according to DIN ENV 14 242), PZT (denoting a term according to DIN ENV 14 242), SiO2 (denoting a term according to DIN ENV 14 242), TiO2 (denoting a term according to DIN ENV 14 242). Also, Spinel or Mullite materials, both denoting commonly used engineering terms, may be covered by the term "ceramic". According to the presently described exemplary embodiment, a ceramic-based inorganic material is used for encapsulating one or more electronic components of a package partially or entirely. It has turned out that a ceramic material has excellent properties in terms of encapsulating chips and other electronic components. Firstly, ceramic materials are reliably electrically insulating and mechanically robust so as to provide an excellent mechanical and electrical protection of the encapsulated electronic component. At the same time, the adhesion between electronic component and ceramic encapsulant can be rendered very stable, in particular when an adhesion promoter is sandwiched in between. Furthermore, also the properties in terms of a correspondence between a coefficient of thermal expansion of the ceramic encapsulant and a coefficient of thermal expansion of the electronic component may be reasonably small so that the thermal stress in an interior of the package can be kept sufficiently small to maintain integrity of the package even in the presence of extensive thermal cycles during long-term use.

In an embodiment, the ceramic-based encapsulant comprises at least one of the group consisting of cement, concrete, gypsum, and mortar. The mentioned materials show excellent properties in terms of encapsulating electronic components and are therefore highly appropriate for the mentioned use. In particular, a cement-based encapsulant may be highly advantageous for this purpose.

In another embodiment, the encapsulant is an inorganic (i.e. not comprising organic carbon) polymer-based encapsulant, such as a silicon polymer (i.e. an inorganic polymer comprising silicon) or an aluminum polymer (i.e. an inorganic polymer comprising aluminum). Inorganic polymers may denote polymers with a skeletal structure that does not include carbon atoms in the backbone.

In an embodiment, the adhesion promoter of the package is a morphological adhesion promoter, i.e. an adhesion promoter having a morphological structure. Correspondingly, the manufacturing method may comprise forming an adhesion promoter, in particular a morphological adhesion promoter, on the electronic component before the encapsulating. In the context of the present application, the term "morphological structure" may particularly denote a structure having a topology and/or porous structure and/or being shaped in such a way so as to increase the connection surface with connected material of encapsulant and/or electronic component to thereby promote adhesion. Moreover, the morphology of a morphological adhesion promoter may cause an advantageous mechanical interlocking between material of encapsulant and/or electronic component on the one hand and material of the morphological adhesion promoter on the other hand. In other words, a morphological structure promotes adhesion due to its shape, rather than only promoting adhesion due to its chemistry. However, it is also possible that a morphological structure is synergistically made of material which, in view of its intrinsic properties, promotes adhesion additionally to the shape. In particular, a morphological adhesion promoter may be an inorganic porous material. For instance, the presence of a morphological structure between electronic component and cement-based encapsulant may additionally promote the interconnection between semiconductor chip and encapsulant so as to further improve reliability. Highly advantageously, the adhesion promoter may promote adhesion at least partially as a result of its morphology. Thus, a specific shaping and in particular increase of the interior surface of the adhesion promoter may enhance adhesion between chip and encapsulant, mediated by the morphological adhesion promoter.

In an embodiment, the morphological adhesion promoter comprises at least one of the group consisting of a metallic structure, an alloy structure, a chromium structure, a vanadium structure, a molybdenum structure, a zinc structure, a manganese structure, a cobalt structure, a nickel structure, a copper structure, a flame deposited structure, a roughened metal structure (in particular a roughened copper structure or a roughened aluminum oxide structure), and any oxide, nitride, carbide, and selenide of any of said structures. All structures may comprise or consist of these metals and/or the alloys thereof. In addition, these structures may comprise or consist of these metals and their alloy-oxides. In particular, single oxides and mixed oxides are possible in different embodiments. Whether the alloy oxidizes or not may depend on the thermal budget in production. However, other materials and structures may be used for the morphological adhesion promoter as well (see also FIG. 3 to FIG. 13). The above-mentioned flame deposited structure may comprise or consist of silicon dioxide, any titanium oxide (such as for instance $TiO_2$, TiO, $Ti_xO_y$), etc. Any organometallic precursor can be used that can be burned in a mixture with a burning gas such as propane or butane and form the specific metal oxide.

In particular, a morphological adhesion promoter may be formed using Atomic Layer Deposition (ALD), Chemical Vapor Deposition (CVD), etc.

In another embodiment, the adhesion promoter is an organic adhesion promoter, such as silane. Such an organic adhesion promoter may promote adhesion in view of its chemical properties.

In an embodiment, the (in particular morphological) adhesion promoter has a plurality of openings. Such openings may have an ordered structure, as for instance in the presence of a layer being patterned in accordance with a well-defined mask. Such a mask may have a regular array of openings which translates into a regular array of openings in the morphological adhesion promoter. However, it is also possible and even preferred when the openings of the morphological adhesion promoter have a non-ordered, in particular arbitrary or random character. This can be achieved for instance by a non-specific etching process generating a random arrangement of openings for increasing the surface and promoting interlocking.

In an embodiment, the openings comprise at least one of the group consisting of pores, dendrites, and gaps between islands of a patterned structure. However, other kinds of openings can be formed as well as long as they increase the surface of the morphological adhesion promoter and promote mechanical interlocking between material of the adhesion promoter and material of the encapsulant. For instance, an adhesion promoter layer may comprise or consist of plates with 10 nm to 500 nm size, for example hexagonal, round shape and in multiple angle orientation forming a microscopic porous surface with a pore size in the range of 10 nm to 500 nm. The surface of the plates may be additionally covered with a sponge of a porous layer of 10 nm to 100 nm with a much lower pore size in the range of 1 nm to 100 nm.

In an embodiment, a material of the adhesion promoter is adapted for at least partially compensating a mismatch of the coefficient of thermal expansion (CTE) between a material of the electronic component and a material of the encapsulant. Highly advantageously, the adhesion promoter not only serves for enhancing adhesion between electronic component and inorganic encapsulant by promoting mechanical interlocking, but may at the same time provide a smooth transition of the CTE value between electronic component (in particular a pad thereof) and the inorganic encapsulant. Without the adhesion promoter, a sudden jump of the CTE value may occur at an interface between electronic components (in particular a semiconductor chip with metal pad) and the inorganic (in particular ceramic) encapsulant in view of the different materials (ceramic, metal, semiconductor) of encapsulant and electronic component. However, when the morphology and/or the material of the adhesion promoter is configured so as to provide a CTE gradient in between the CTE values of the inorganic encapsulant and the material of the electronic component, a smooth transition may be achieved and the formation of mechanical stress in an interior of the package in the event of rapidly changing temperatures can be suppressed. In particular, it is possible that the morphology of the adhesion promoter contributes to a smooth or even continuous transition of the CTE value. When for instance the cross-sectional area of the openings in the adhesion promoter decreases from the encapsulant towards the electronic component, the amount of material of the encapsulant inside of such openings may gradually decrease spatially from the pure encapsulant towards a surface of the electronic component. Thus, also the morphology of the adhesion promoter may contribute to a smooth transition of the CTE value, so as to further increase mechanical reliability of the package.

In an embodiment, the adhesion promoter forms an interlayer in an interface region between the encapsulant and the electronic component. In particular, a porous interlayer may provide a (in particular continuous) transition of porosity between the encapsulant and the electronic component. In the context of the present application, the term "porosity" may denote a ratio between a pore volume and a total volume (i.e. a sum of the pore volume and a solid material volume) of a porous body such as the morphological interlayer. Thus, a separate layer with spatially varying porosity may be interposed between electronic component and encapsulant and may serve as adhesion promoter with gradually varying physical properties. The material of such an interlayer may be selected so as to further improve adhesion, reduce a CTE mismatch, etc. For this purpose, it is for instance possible that the pores of the interlayer are at least partially filled with material of the encapsulant. In combination with the spatially varying porosity of the interlayer, this may result in a gradual CTE transition.

Preferably, the interlayer has a thickness in a range between 30 nm and 500 nm, in particular in a range between 50 nm and 200 nm. for instance, the thickness of the interlayer may be about 100 nm. Over the thickness of the adhesion promoter interlayer, porosity (i.e. the ratio between pore volume on the one hand and the sum of pore volume and solid volume on the other hand) may be decreased for example from 90% (close to an interface to the encapsulant) to 10% (close to the interface of the electronic component).

In an embodiment, the interlayer comprises at least one of the group consisting of a polymer, a gel, an inorganic layer, an organic layer, and at least one gas, a particular air or nitrogen. However, other materials may be used as well.

In an embodiment, the (in particular ceramic-based) inorganic encapsulant has inherently non-flammable properties. Thus, in view of such intrinsic non-flammable properties of the inorganic encapsulant, the encapsulant may be free of non-flammable additives. Advantageously, the ceramic material of the encapsulant itself may have non-flammable properties so that the addition of an additive with non-flammable properties may be omitted in the encapsulant. As a result, the composition of the encapsulant may be rendered simple, so that encapsulation of the one or more electronic components can be accomplished with reduced effort.

In an embodiment, the method comprises forming the encapsulant by providing a mixture of a solution and filler particles in the solution, as a precursor for forming the finally solid encapsulant. In the context of the present application, the term "solution" may particularly denote a liquid or flowable medium, and/or a slurry. In the context of the present application, the term "filler particles" may particularly denote a (in particular powderous or granulate-type) substance filling out interior volumes in the matrix. By the selection of the filler, the physical and/or chemical properties of the encapsulant can be adjusted. Such properties may include the coefficient of thermal expansion, the thermal conductivity, the dielectric properties, etc. The mixture of solution and filler particles may translate, after curing, into an encapsulant composed of a matrix of ceramic material with (ceramic or non-ceramic) filler particles within this solid matrix. The matrix may provide a robust constituent of the encapsulant and may ensure mechanical integrity. The filler particles may be optionally added so as to fine tune the physical, chemical, etc. properties of the encapsulant. For instance, the filler particles may increase thermal conductivity of the encapsulant so as to efficiently remove heat out of an interior of the package (such heat may be generated by the electronic component, for instance when embodied as power semiconductor chip). It is also possible that the filler particles provide an improved dielectric decoupling between the electronic component and the surrounding of the package.

In an embodiment, the method comprises providing the solution with a non-aqueous solvent, in particular an alcohol. Thus, the liquid phase may be different from an aqueous solvent in order to make it possible to control the reaction kinetics. However, alternatively, the liquid phase may also comprise or consist of water.

In an embodiment, the method comprises contacting the morphological adhesion promoter with the solution as one of precursors of the encapsulant in such a way that the solution penetrates into openings in the morphological adhesion promoter. With such a manufacturing procedure, it is possible that the liquid precursor material of the encapsulant efficiently inserts into openings of the morphological adhesion promoter on the one or more electronic components. After curing and solidifying the precursor material of the encapsulant, the openings may remain permanently filled with encapsulant material. As a result, a smooth transition of the CTE value and/or of other physical and/or chemical properties between the inorganic (in particular ceramic) encapsulant and the electronic component (in particular a semiconductor chip with metal pads) may be accomplished. After curing, the liquid precursor solidifies and permanently remains within the openings so as to establish a smooth transition of the properties between chip and encapsulant.

In an embodiment, the encapsulant further comprises at least one additive. In particular, such at least one additive may have a maximum weight percentage, based on the total weight of the encapsulant, of less than 5 weight percent, in particular less than 1 weight percent. With the addition of one or more additives, the specific properties of the encapsulant can be adjusted in accordance with a desired application.

In an embodiment, the at least one additive is selected from a group consisting of a pigment, a stress modifier, an ion capturer and a release agent. The addition of a pigment may allow to adjust the color of the encapsulant. For instance, the encapsulant may be rendered intransparent so as to avoid any undesired interaction between light and an electronic component encapsulated within the encapsulant. By the addition of a stress modifier, the thermal stress in an interior of a package in form of an encapsulated electronic component may be adjusted. An ion capturer may capture charged particles in an interior of a package or package so as to ensure a proper electric insulation of the encapsulant. The provision of a release agent may promote the simple release of a cured encapsulant out of an encapsulation tool.

In an embodiment, the filler particles are selected from a group consisting of crystalline silica, fused silica, spherical silica, titanium oxide, aluminium hydroxide, magnesium hydroxide, zirconium dioxide, calcium carbonate, calcium silicate, talc, clay, carbon fiber, glass fiber and mixtures thereof. Other filler materials are however possible depending on the demands of a certain application. Filler particles (for example $SiO_2$, $Al_2O_3$, $Si_3N_4$, BN, AlN, diamond, etc.), for instance for improving thermal conductivity may be embedded in the encapsulant. However, other filler particles may be implemented in the encapsulant as well, in addition or alternatively to the mentioned filler particles. In particular, organic particles may be used as fillers (for instance, fillers can also comprise or consist of polymers or polymer mixtures, such as: epoxies, polyethylene, polypropylene, etc.). Also, it should be mentioned that the filler can be treated in a way to improve the adhesion between the filler and the encapsulant comprising the filler. Filler coatings can be of the group of silanes, thiols, or porous structures. Also, porous fillers can be used. In particular, filler particles may be provided as nanoparticles or microparticles. Filler particles may have identical dimensions or may be provided with a distribution of particle sizes. Such a particle size distribution may be preferred since it may allow for an improved filling of gaps in an interior of the encapsulant. For instance, a dimension of the filler particles may be in the range between 1 nm and 200 µm, in particular in a range between 10 nm and 20 µm, more particularly in a range between 2 µm and 5 µm. For instance, the shape of the filler particles may be randomly, spherical, cuboid-like, flake-like, and film-like. The filler particles can be modified, coated, and/or treated as to improve the adhesion and/or the chemical binding to the surrounding matrix. Examples are silanes. A coating can also change the surface energy of the fillers and may thereby improve and enable the wetting of the solution/the matrix.

In an embodiment, the package comprises a carrier on which the electronic component is mounted. For instance, such a carrier may be a leadframe (for instance made of copper), a DAB (Direct Aluminum Bonding), DCB (Direct Copper Bonding) substrate, etc. Also at least part of the carrier may be encapsulated by the encapsulant, together with the electronic component. The mentioned carrier may have a metallic surface which may be prone to corrosion. However, when using an inorganic encapsulant in combination with an adhesion promoter, the carrier may be encapsulated in the encapsulant without the risk of corrosion.

Preferably, also the carrier can be at least partially covered by an adhesion promoter as described herein before being at least partially encapsulated by an encapsulant as described herein. This may further improve mechanical reliability of the package. In other words, all embodiments relating to the adhesion promoter and all embodiments relating to the encapsulant and described in detail for the electronic component apply also to the carrier.

In an embodiment, the package comprises an electrically conductive contact element electrically coupling the electronic component with the carrier. For instance, the electrically conductive contact element may comprise a clip, a wire bond, and/or a ribbon bond. A clip may be a three-dimensionally bent plate type connection element which has two planar sections to be connected to an upper main surface of the respective electronic component and an upper main surface of the chip carrier, wherein the two mentioned planar sections are interconnected by a slanted connection section. As an alternative to such a clip, it is possible to use a wire bond or ribbon bond which is a flexible electrically conductive wire or ribbon shaped body having one end portion connected to the upper main surface of the respective chip and having an opposing other end portion being electrically connected to the chip carrier.

Preferably, also the carrier can be at least partially covered by an adhesion promoter as described herein before being at least partially encapsulated by an encapsulant as described herein. This may further improve mechanical reliability of the package. In other words, all embodiments relating to the adhesion promoter and all embodiments relating to the encapsulant and described in detail for the electronic component apply also to the carrier.

In an embodiment, the method comprises pre-treating at least part of the electronic component, carrier and/or electrically conductive contact element for promoting adhesion between the encapsulant and at least part of the electronic component, carrier and/or electrically conductive contact element. Thus, the adhesion between the above-described encapsulant and the electronic member may be improved by applying an adhesion promoting additional device-level treatment. Highly advantageously, it is possible to pre-treat the package or part thereof (for instance a metallic surface thereof) so as to improve its adhesion properties with regard to the above-described encapsulant. For instance, it is possible to roughen the surface of the package or part thereof before encapsulation by the encapsulant. Such a roughening may be carried out mechanically (for instance by grinding), chemically, by a laser treatment, etc. It is also possible to carry out a surface activation of the surface of the package or part thereof to be encapsulated by the encapsulant. Such a surface activation may be accomplished, for instance, by a plasma treatment of the respective surface, in particular of the respective metallic surface.

In an embodiment, the package is configured as one of the group consisting of a leadframe connected power module, a Transistor Outline (TO) package, a Quad Flat No Leads Package (QFN) package, a Small Outline (SO) package, a Small Outline Transistor (SOT) package, and a Thin Small Outline Package (TSOP) package. Also, packages for sensors and/or mechatronic devices are possible embodiments. Moreover, exemplary embodiments may also relate to packages functioning as nano-batteries or nano-fuel cells or other devices with chemical, mechanical, optical and/or magnetic actuators. Therefore, the package according to an exemplary embodiment is fully compatible with standard packaging concepts (in particular fully compatible with standard TO packaging concepts) and appears externally as a conventional package, which is highly user-convenient.

In an embodiment, the package is configured as power module, for instance molded power module. For instance, an exemplary embodiment of the package may be an intelligent power module (IPM). Another exemplary embodiment of the package is a dual inline package (DIP).

In an embodiment, the electronic component is configured as a power semiconductor chip. Thus, the electronic component (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide). A semiconductor power chip may comprise one or more field effect transistors, diodes, inverter circuits, half-bridges, full-bridges, drivers, logic circuits, further devices, etc.

In an embodiment, the electronic component experiences a vertical current flow. The package architecture according to exemplary embodiments is particularly appropriate for high power applications in which a vertical current flow is desired, i.e. a current flow in a direction perpendicular to the two opposing main surfaces of the electronic component, one of which being used for mounting the electronic component on the carrier.

As substrate or wafer forming the basis of the electronic components, a semiconductor substrate, in particular a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION

Figure 1:
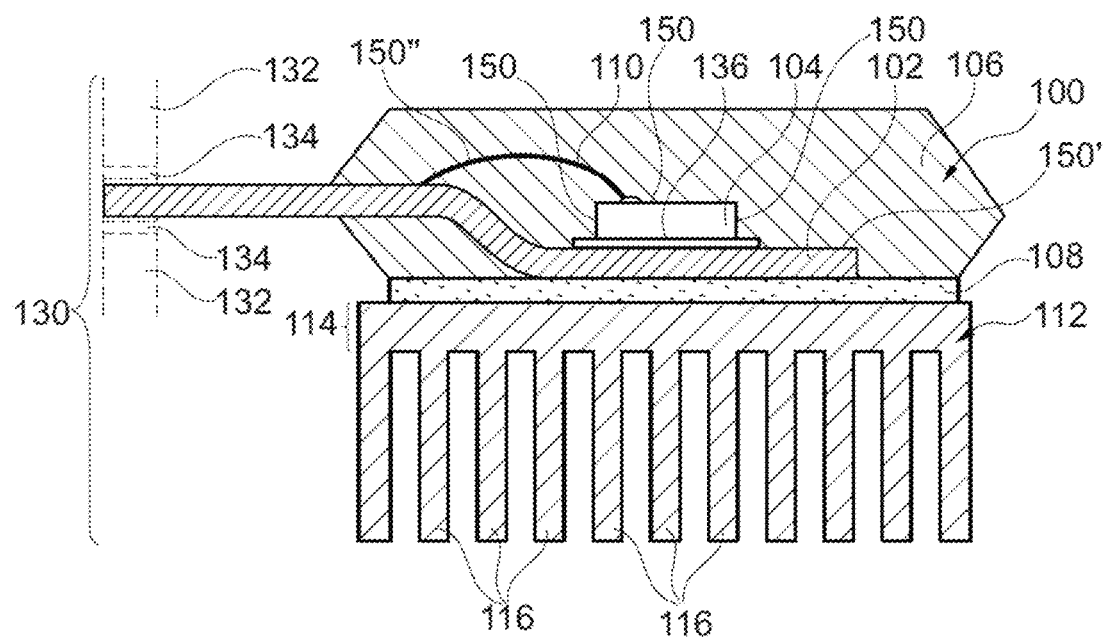
FIG. 1 illustrates a cross-sectional view of a package according to an exemplary embodiment to be mounted on a mounting structure.

The illustration in the drawing is schematically and not to scale.

Before exemplary embodiments will be described in more detail referring to the figures, some general considerations will be summarized based on which exemplary embodiments have been developed.

According to exemplary embodiments, an encapsulant is provided comprising or consisting of an inorganic material—in particular ceramics (for example concrete)—combined with a—preferably morphological—adhesion promoter.

Existing epoxy-based molding compounds have very high coefficients of thermal expansion (CTE) with limited yield strength. In addition, these thermosets may tend to crack along interfaces and in bulk. Furthermore, delamination at the interface may happen in such conventional approaches.

Moreover, besides mechanical and thermomechanical limitations, existing polymer based encapsulation may have a limitation regarding thermal degradation and may start to degrade already at very low temperature of 200° C. Specific semiconductor materials (such as GaN, SiC or modern MOSFET generations) may however require much higher temperature stability of the respective package of up to 300° C. which cannot be achieved with conventional encapsulation materials, for example epoxy-based polymeric encapsulants.

Conventional epoxy mold compounds may have inorganic fillers (for example $SiO_2$) with high filler contents to reduce the CTE value of the bulk material. To increase the adhesion of the mold compound towards a semiconductor chip, leadframe and other interfaces, various adhesion promoter molecules may be added. In addition to the adhesion promoters, these mold compounds may comprise various different chemicals, such as flame-retardants. However, possible reactions between the different components at higher temperatures may lead to additional chemical species that may be dangerous for the package.

Limitations of conventional encapsulants based on hydrocarbon-based encapsulation materials (epoxy, etc.) include their limited yield strength, high CTE and low temperature resistance, as such materials may decompose quickly at higher temperature.

In order to overcome at least part of the above-mentioned and/or other shortcomings, an exemplary embodiment uses an inorganic encapsulation material, in particular a ceramic encapsulation material. Using ceramic-based inorganic materials (for example concrete) may offer a much lower CTE at much higher yield strength. Since concrete materials may be non-flammable non-polymers, additives such as flame retardants can be omitted, thus reducing the complexity of the encapsulation material. Additionally, concrete offers a far broader stability when it comes to higher temperatures of more than 300° C. Conventional mold compounds already show stability weakness at 200° C.

Details of ceramic formulations of encapsulants used according to an exemplary embodiments and their solidification mechanism are shown in Table 1 below.

TABLE 1

Table 1: Overview of ceramic formulations and inorganic polymer formulations and their different phases to interact with any of the adhesion promoters described in Table 3

| Material | Liquid phase | Solid phase matrix in bulk | Solidification of liquid phase | Additives |
|---|---|---|---|---|
| Concrete | Soluble Ca-oxide and Si-oxde phases (for example $Ca(OH)_2$; maximum concentration 1.7 g/L in water at 20° C.) (*1) | $Al_2O_3$, $SiO_2$, $Fe_2O_3$ | Formation of hydrates of Ca-oxide, Ca-Aluminates, Ca-Silicates | Concrete 23iquefier, Super-plasticizer, Stabilizer, Airtrap former, Accelerator for solidification: $CaCl_2$, carbonate, $Na_2CO_3$, aluminate, Tricalcium-aluminate, Inhibitor, Sealing agents |
| Gypsum | Soluble Ca-sulfate and its hydrides (for example $CaSO_4$; maximum concentration 2 g/L in water) (*1) | Ca-sulfate hydrates | Formation of Ca-sulfate hydrates | |
| Mortar | Soluble Ca-oxide and Si-oxide phases (for example $Ca(OH)_2$; maximum concentration 1.7 g/L in water at 20° C.) (*1) | $CaCO_3$, CaOH and its hydrides | Formation of hydrates of Ca-oxide, further solidifycation with absorption of $CO_2$: $Ca(OH)_2$ + $CO_2$ -> $CaCO_3$ + $H_2O$ | |
| Silicon polymer | Silicate | | | |
| Aluminum polymer | Aluminate | | | |

((*1): Solvents: Besides water also alcohols and/or other solvents may be used)

Table 2 shows different types of cements which may be used as ceramic-based encapsulant of a package of an exemplary embodiment.

TABLE 2

Table 2: Examples for cement components used for concrete formulations

| Property | Portland cement | Siliceous fly ash | Calcareous fly ash | Slag cement | Silica fume |
|---|---|---|---|---|---|
| Silicon oxide content (%) | 21.9 | 52 | 35 | 35 | 85 to 97 |

TABLE 2-continued

Table 2: Examples for cement components used for concrete formulations

| Property | Portland cement | Siliceous fly ash | Calcareous fly ash | Slag cement | Silica fume |
|---|---|---|---|---|---|
| Aluminum oxide (%) | 6.9 | 23 | 18 | 12 | |
| Iron oxide (%) | 3 | 11 | 6 | 1 | |
| Calcium oxide (%) | 63 | 5 | 21 | 40 | <1 |
| Magnesium oxide (%) | 2.5 | | | | |
| $SO_3$ (%) | 1.7 | | | | |

Using a morphological adhesion promoter as a base for the ceramic encapsulation material may allow for efficiently improving intra-package adhesion within a package according to an exemplary embodiment.

In embodiments, the ceramic based materials may be manufactured and processed as a mixture of solution and particles to encapsulate the electronic component(s). To ensure a proper interaction between the encapsulation material and a morphological adhesion promoter, the morphological adhesion promoter may be preferably applied before the application of the encapsulation material.

At the time when the liquid encapsulation material is getting contact to the morphological adhesion promoter, the liquid part of the mixture, during application on the electronic component, may be able to penetrate into pores of the adhesion promoter layer. Possible morphological adhesion promoters which may be used according to exemplary embodiments are shown in Table 3. For all these morphological adhesion promoters the given pore sizes and layer thickness can be adapted to the respective encapsulation material by correspondingly adjusting deposition process parameters.

Again referring to Table 3, the chromium, vanadium and molybdenum-based adhesion promoters may be formed by galvanic deposition of the corresponding inorganic material. Thus, the three mentioned adhesion promoters are all an inorganic morphological adhesion promoters with a sponge-like pore structure. A flame deposited adhesion promoter may be a porous silicon oxide layer deposited from a gas phase, for instance using a flame, and is also a morphological adhesion promoter. Rough copper can be created by a corresponding copper etching procedure of a copper layer which causes porosity of the surface of the etched copper layer, thereby producing this morphological copper-based adhesion promoter. In a similar way, aluminum oxide may be roughened. Such an aluminum oxide material may be formed by thermal oxidation of aluminum or by ALD (atomic layer deposition). What concerns a wet chemical etching process for an ALD layer, it should be mentioned that this is only an exemplary way of getting the layer porous. For instance, water vapor can be already enough to get the porous layer. In addition, aluminium oxide may be formed porous by Chemical Vapor Deposition (CVD) with specific gas composition of aluminium organyl in the chamber. Apart from this, also silicon nitride can be deposited porous with a specific ratio between TEOS (tetraethylsilane) and ammonia ($NH_3$) and specific deposition conditions regarding concentration and temperature. By a subsequent wet etching procedure, the created aluminum oxide may be rendered porous, wherein the pores may for instance have a substantially columnar and/or substantially spherical shape.

As an alternative to the mentioned inorganic morphological adhesion promoters, it is also possible to use an organic adhesion promoter, for instance silane.

A liquid precursor or a liquid part of the encapsulation material may crystalize in a sponge layer or in pores of a morphological adhesion promoter through formation of a solid phase, for example for concrete formation of crystalline hydrates.

During this solidification of the liquid phase in the porous morphological adhesion promoter sponge, the morphological adhesion promoter and the encapsulation material may form a mixture of fiber/encapsulation interlayer. Besides a strong adhesion, this interlayer enables a CTE adaption from the electronic component, carrier or substrate to the encapsulation material. The ratio between adhesion promoter volume fraction and encapsulation material volume fraction may continuously change within the formed interlayer. The average CTE of the nano-structured layer may change from CTE (electronic component, carrier or substrate) to CTE (encapsulation material) continuously, depending on the pore size and the porosity. Therefore, the formed interlayer (which may be composed of material of the morphological adhesion promoter and material of the encapsulant, with spatially varying percentages) may form a layer with a continuous change of the CTE value from the electronic component or device substrate to the encapsulation material. A CTE mismatch between electronic component or device substrate on the one hand and encapsulation material on the other hand, which may generate stress (in particular thermomechanical stress), may be partially or even entirely compensated. Together with the advantageously low-CTE characteristic of a ceramic encapsulation, this may lead to stress reduction or even minimization in the package.

Besides adhesion promotion and stress reduction, the morphological adhesion promoter may also act as a corrosion barrier. Especially together with the ceramic encapsulation, the formed interlayer may act as a protection from water and oxygen.

In particular in case of a morphological adhesion promoter using Cr, V, or Mo, the adhesion to the device surface can be made also via a seed layer of the actual adhesion promoter layer as a metallurgical contact. Such a seed layer may also act as a corrosion barrier.

Table 3 shows an overview of morphological adhesion promoters which may be used according to exemplary embodiments:

TABLE 3

Table 3: Overview of morphological adhesion promoters that may interact with liquid-phase encapsulation materials (other materials are possible in other embodiments, in particular: a metallic structure, an alloy structure, a chromium structure, a vanadium structure, a molybdenum structure, a zinc structure, a manganese structure, a cobalt structure, a nickel structure, a copper structure, a flame deposited structure, a roughened metal structure, in particular a roughened copper structure or a roughened aluminum oxide structure, and any oxide, nitride, carbide, and selenide of said structures)

| Adhesion promoter | Material of layer | Pore size | Layer thickness | Preparation/deposition process |
|---|---|---|---|---|
| Cr | ZnCr-oxide and ZnCr-alloy including seed layer | 1-500 nm | 1-500 nm | Galvanic and electroless deposition with pulse plating and plating, or |
| V | ZnV-oxide and ZnV-alloy | 1-500 nm | 1-500 nm | constant current |

TABLE 3-continued Table 3: Overview of morphological adhesion promoters that may interact with liquid-phase encapsulation materials (other materials are possible in other embodiments, in particular: a metallic structure, an alloy structure, a chromium structure, a vanadium structure, a molybdenum structure, a zinc structure, a manganese structure, a cobalt structure, a nickel structure, a copper structure, a flame deposited structure, a roughened metal structure, in particular a roughened copper structure or a roughened aluminum oxide structure, and any oxide, nitride, carbide, and selenide of said structures)

| Adhesion promoter | Material of layer | Pore size | Layer thickness | Preparation/deposition process |
|---|---|---|---|---|
| Mo | including seed layer ZnMo-oxide and ZnMo-alloy including seed layer | 1-500 nm | 1-500 nm | |
| Flame deposited | $SiO_2$, Si—O—C | 1-500 nm | 1-500 nm | Flame or plasma deposition with precursors (*1) |
| Rough Cu | Etched Cu surface from various Cu alloys | 1-500 nm | 1-500 nm | Anisotropic etching of Cu or its alloys at grain boundaries (*2) |
| $Al_2O_3$ rough | $Al_2O_3$ | 1-500 nm | 1-500 nm | Thermal oxidation of aluminum or deposition of $Al_2O_3$ from gas phase (atom layer deposition); treatment with aqueous solutions to form sponge and dendrites |

(*1): Precursors: Tetraethylsilane, Hexamethyldisiloxane, Hexamethyldisilane, Ti-organyls
(*2): Example Cu roughening with $H_2SO_4/H_2O_2$ etching with benzotriazole additive to enhance selectivity of etching to grain boundaries FIG. 1 illustrates a cross-sectional view of a package 100, which is embodied as a Transistor Outline (TO) package, according to an exemplary embodiment. The package 100 is mounted on a mounting structure 132, here embodied as printed circuit board, for establishing an arrangement 130.

The mounting structure 132 comprises an electric contact 134 embodied as a plating in a through hole of the mounting structure 132. When the package 100 is mounted on the mounting structure 132, an electronic component 104 of the package 100 is electrically connected to the electric contact 134 via an electrically conductive carrier 102, here embodied as a leadframe made of copper, of the package 100.

The package 100 thus comprises the electrically conductive carrier 102, the electronic component 104 (which is here embodied as a power semiconductor chip) adhesively (see reference numeral 136) mounted on the carrier 102, and an encapsulant 106 encapsulating part of the carrier 102 and part of the electronic component 104. As can be taken from FIG. 1, a pad on an upper main surface of the electronic component 104 is electrically coupled to the carrier 102 via a bond wire as electrically conductive contact element 110.

During operation of the power package or package 100, the power semiconductor chip in form of the electronic component 104 generates a considerable amount of heat. At the same time, it shall be ensured that any undesired current flow between a bottom surface of the package 100 and an environment is reliably avoided.

For ensuring electrical insulation of the electronic component 104 and removing heat from an interior of the electronic component 104 towards an environment, an electrically insulating and thermally conductive interface structure 108 may be provided which covers an exposed surface portion of the carrier 102 and a connected surface portion of the encapsulant 106 at the bottom of the package 100. The electrically insulating property of the interface structure 108 prevents undesired current flow even in the presence of high voltages between an interior and an exterior of the package 100. The thermally conductive property of the interface structure 108 promotes a removal of heat from the electronic component 104, via the electrically conductive carrier 102 (of thermally properly conductive copper), through the interface structure 108 and towards a heat dissipation body 112. The heat dissipation body 112, which may be made of a highly thermally conductive material such as copper or aluminum, has a base body 114 directly connected to the interface structure 108 and has a plurality of cooling fins 116 extending from the base body 114 and in parallel to one another so as to remove the heat towards the environment.

Although FIG. 1 shows a very specific packaging architecture, the use of the encapsulant 106 which will be described below in further detail is advantageous also for any other packaging architectures of packages 100, etc.

As will be described below referring to FIG. 2, the encapsulant 106 may be a ceramic-based inorganic encapsulant material, for instance cement. Moreover, a morphological adhesion promoter 150 may be arranged between the electronic component 104 and the ceramic encapsulant 106, as will be described below referring to FIG. 2 as well.

As indicated schematically by reference numeral 150' in FIG. 1, it is possible that also at least part of the carrier 102 (in particular a portion of the carrier 102 in contact with the encapsulant 106) is covered by an adhesion promoter such as the adhesion promoter 150 covering at least part of the electronic component 104. Additionally or alternatively and as indicated schematically by reference numeral 150" in FIG. 1, it is also possible that also at least part of the electrically conductive contact element 110 is covered by an adhesion promoter such as the adhesion promoter 150 covering at least part of the electronic component 104. By taking this measure, the stability of the package 100 may be further increased and the tendency of delamination within package 100 may be further suppressed.

Figure 2:
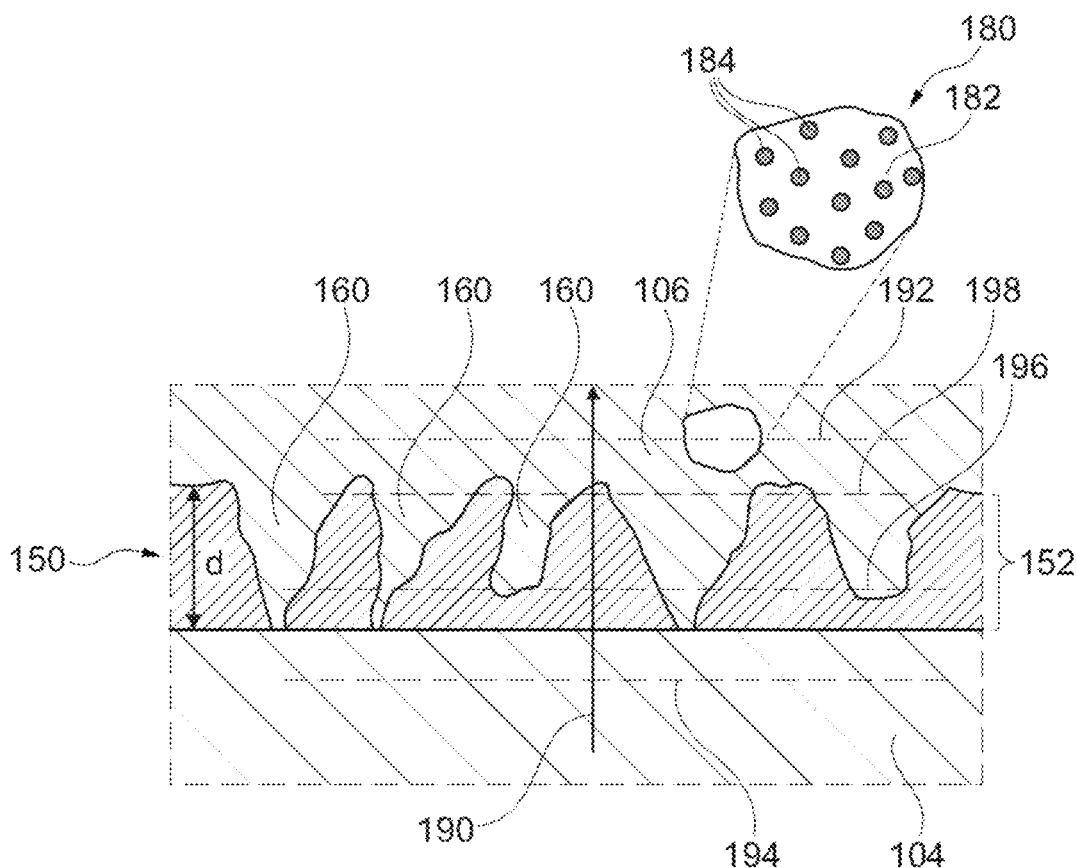
FIG. 2 schematically illustrates an interface region with a morphological adhesion promoter between an electronic component and an inorganic ceramic-based encapsulant according to an exemplary embodiment.

FIG. 2 schematically illustrates an interface region with morphological adhesion promoter 150 between electronic component 104 (for instance, the shown part of the electronic component 104 in FIG. 2 may be a pad, such as an aluminum or copper pad, on a semiconductor body) and inorganic ceramic-based encapsulant 106 according to an exemplary embodiment.

As already mentioned above, the encapsulant 106 may comprise cement, concrete, or alternatively gypsum or mortar. Such a ceramic-based inorganic encapsulant 106 may have inherently non-flammable properties, so that the addition of non-flammable additives may be dispensable. This renders the encapsulant 106 simple in manufacture. In particular, the combination of a morphological adhesion promoter 150 and a ceramic encapsulant 106 may be highly advantageous. This ensures proper adhesion, keeps thermomechanical stress small, enables efficient heat removal, prevents corrosion, and ensures thermal stability in the presence of very high temperatures.

For instance, the schematically illustrated morphological adhesion promoter 150 may be a roughened copper structure or a porous Zn/Cr layer having pores into which material of the encapsulant 106 (which may be at least partially liquid or flowable during manufacture) may penetrate. Roughening of a copper material may be accomplished for instance by a plasma treatment, by wet etching, and/or by a mechanical treatment.

As shown in FIG. 2, the adhesion promoter 150 has a plurality of openings 160 in the form of pores with varying diameter. The material of the adhesion promoter 150 may be selected for partially or entirely compensating a mismatch of the coefficient of thermal expansion between the material of the electronic component 104 and the material of the encapsulant 106.

Adhesion promoting interlayer 152 forms an interface between the encapsulant 106 and the adhesion promoter 150. For instance, a vertical thickness, d, of the interlayer 152 can be 100 nm. The interlayer 152 constitutes a continuous transient between material of the encapsulant 106 and material of the adhesion promoter 150, as will be described in the following in further detail: For manufacturing the structure shown in FIG. 2, it may be possible to form the encapsulant 106 on and in the adhesion promoter 150 by providing a mixture of a solution and particles in the solution, as a precursor of the encapsulant 106. During manufacture of the encapsulant 106, the solution may flow inside the pore type openings 160 of the morphological adhesion promoter 150. This liquid phase or flowable matrix may then be cured or solidified (for instance by hydration or polymerization) and may thus remain in a solid phase permanently within the pores of the morphological adhesion promoter 150. This results in an encapsulant 106 comprising a solid matrix 182 (formed on the basis of the previously liquid precursor) and filler particles 184 embedded in the matrix 182. When the morphological adhesion promoter 150 has been formed on the electronic component 104 before the encapsulating, it may be possible to contact the morphological adhesion promoter 150 with the solution as one of precursors of the encapsulant 106 in such a way that the solution penetrates into the openings 160 in the morphological adhesion promoter 150.

With the structure shown in FIG. 2, it may be possible to combine proper adhesion promotion, reliable stress suppression, and provision of a strong corrosion barrier.

Still referring to FIG. 2, the morphological adhesion promoter 150 defining interlayer 152 is arranged to increase the adhesion between encapsulant 106 and electronic component 104, reduce or smoothen a CTE mismatch between encapsulant 106 and chip 102 and suppress undesired corrosion. For this purpose, the morphological adhesion promoter 150 comprises the openings 160 with decreasing diameter from a region in which the package 100 purely consists of encapsulant material up to the electronic component 104. Thus, a liquid precursor used for manufacturing the ceramic-based encapsulant 106 may flow into the openings 160 during the manufacturing process and may contribute to a smooth transition of the coefficient of thermal expansion (CTE) along a vertical or z-axis direction which is indicated with reference numeral 190 in FIG. 2. At a vertical level 192, the CTE value is defined by material of the encapsulant 106 only. At a level 194, the CTE value is defined by material (in particular aluminum of a pad or silicon material of a semiconductor body) of the electronic component 104 only. However, from a vertical level of layer 198 up to another vertical level of layer 196, the amount of material provided by the encapsulant 106 continuously decreases while an amount of material of the adhesion promoter 150 continuously increases. While at vertical level 198, the CTE value is dominated by material of encapsulant 106, the CTE value is dominated by material of the adhesion promoter 150 at level 196. For instance, the porosity (i.e. a ratio between pore volume on the one hand and the sum of pore volume and solid adhesion promoter material volume on the other hand) of the interlayer 152 may be 10% at layer 196, whereas the porosity may be 90% at layer 198. In particular, variation and adjustment of porosity of morphological adhesion promoter 150 by tuning its morphology allows for a smooth CTE transition, compared to thermal mechanically disadvantageous jump functions of CTE at an abrupt interface between encapsulant 106 and electronic component 104. As a result, the CTE mismatch is smoothly changed along direction 190, which reduces thermal load inside of the package 100. Additionally, the morphology of the morphological adhesion promoter 150 promotes mechanical interlocking between encapsulant material and adhesion promoter material and increases the interior surface so as to enhance adhesion between material of encapsulant 106 and material of electronic component 104. By properly selecting the material of the adhesion promoter 150 and of the encapsulant 106, also the tendency of the package 100 of corroding during use in humid environment can be strongly suppressed. Therefore, a highly reliably package 100 can be obtained by an exemplary embodiment.

The cement of the ceramic-based encapsulant 106 may reduce thermomechanical stress due to its highly advantageous CTE properties. Furthermore, the cement material with its crystalline structure may enhance mechanical stability of the package 100. Even more important, thermal stability of cement increases manufacturing and operation temperatures of the package 100 compared to conventional approaches. Moreover, cement material has an excellent thermal conductivity, as compared to other encapsulation materials.

In particular in combination with the morphological adhesion promoter 150, an improved adhesion and a reduced tendency of delamination, as well as an increased tensile strength of the package 100 may be obtained.

A skilled person will understand that the illustration of the pore structure in FIG. 2 is merely schematic and for illustrative purposes. The geometry of such a pore structure may broadly vary depending on the used materials and used processes.

Figure 3:
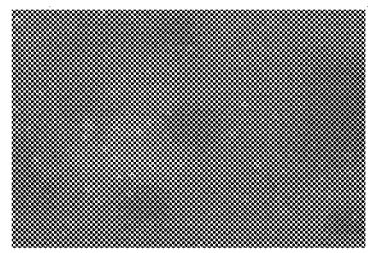
FIG. 3 is a plan view of a morphological adhesion promoter according to an exemplary embodiment comprising manganate.

In the following, different embodiments of deposition layer porosity will be compared:

FIG. 3 is a plan view of a morphological adhesion promoter 150 according to an exemplary embodiment comprising manganite. A flat structure is obtained, no pores.

Figure 4:
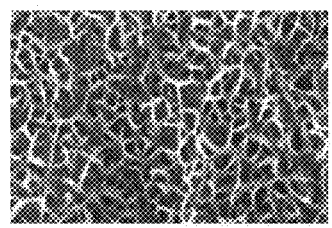
FIG. 4 is a plan view of a morphological adhesion promoter according to an exemplary embodiment comprising zinc-chromium alloy.
Figure 5:
FIG. 5 is a cross-sectional view of the morphological adhesion promoter according to FIG. 4.

FIG. 4 is a plan view of a morphological adhesion promoter 150 according to an exemplary embodiment comprising zinc-chromium alloy and oxide on NiP. FIG. 5 is a cross-sectional view of the morphological adhesion promoter 150 according to FIG. 4. The shown embodiment corresponds to a porous structure on NiP. A sponge-like structure is obtained with features of characteristic size larger than 30 nm.

Figure 6:
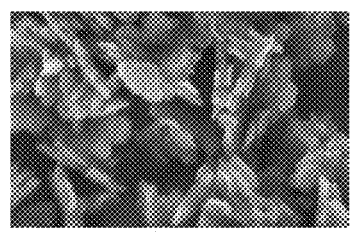
FIG. 6 is a plan view of a morphological adhesion promoter according to an exemplary embodiment comprising zinc vanadium alloy and oxide.
Figure 7:
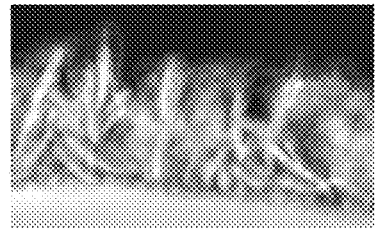
FIG. 7 is a cross-sectional view of the morphological adhesion promoter according to FIG. 6.

FIG. 6 is a plan view of a morphological adhesion promoter 150 according to an exemplary embodiment comprising zinc vanadium alloy and oxide. The shown embodiment corresponds to ZnV on NiP. FIG. 7 is a cross-sectional view of the morphological adhesion promoter 150 according to FIG. 6. A structure with porous plates is obtained with features of characteristic size in a range between 5 nm and 50 nm.

Figure 8:
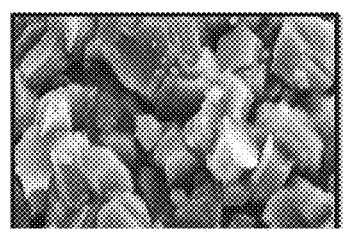
FIG. 8 is a plan view of a morphological adhesion promoter according to an exemplary embodiment comprising zinc molybdenum alloy and oxide.
Figure 9:
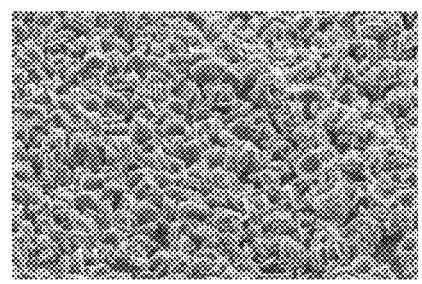
FIG. 9 is a plan view of a morphological adhesion promoter according to an exemplary embodiment comprising zinc-vanadium.
Figure 10:
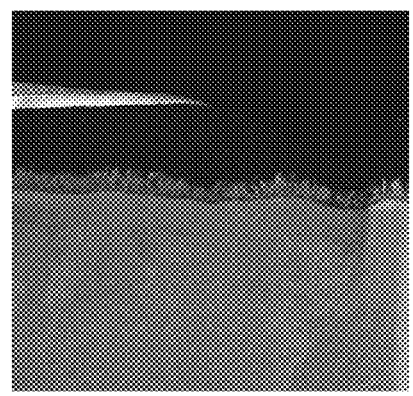
FIG. 10 is a cross-sectional view of the morphological adhesion promoter according to FIG. 9.
Figure 11:
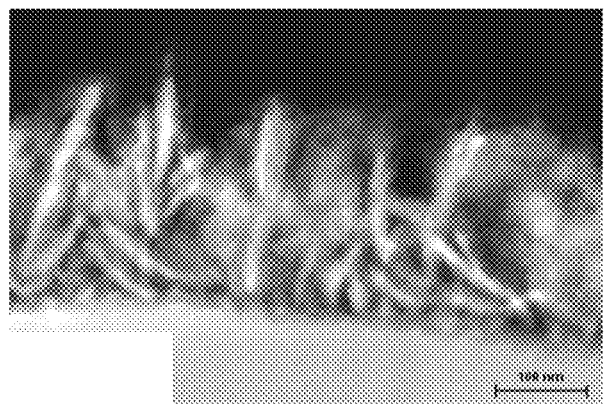
FIG. 11 shows a detail of the cross-sectional view of FIG. 10.
Figure 12:
FIG. 12 shows a detail of the cross-sectional view of FIG. 11.
Figure 13:
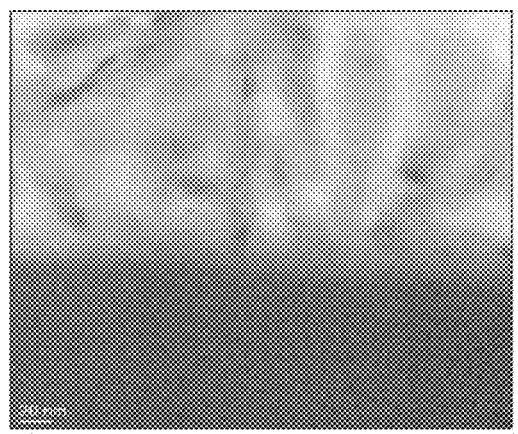
FIG. 13 shows a further detail of the morphological adhesion promoter according to FIG. 9 to FIG. 12 which shows a zinc vanadium seed layer as a starting layer for the final porous adhesion promoter layer.

FIG. 8 is a plan view of a morphological adhesion promoter 150 according to an exemplary embodiment comprising zinc molybdenum alloy and oxide. The shown embodiment corresponds to ZnMo on NiP. A crystal structure is obtained with features of characteristic size much smaller than 30 nm FIG. 9 is a plan view of a morphological adhesion promoter 150 according to an exemplary embodiment comprising zinc-vanadium (Zn—V) on NiP. FIG. 10 is a cross-sectional view of the morphological adhesion promoter 150 according to FIG. 9. FIG. 11 shows a detail of the cross-sectional view of FIG. 10. FIG. 12 shows a detail of the cross-sectional view of FIG. 11. FIG. 13 shows a further detail of the morphological adhesion promoter 150 according to FIG. 9 to FIG. 12. The thickness of the morphological adhesion promoter 150 is about 200 nm. Zn dendrites or crystallites with typical dimensions in the range between 10 nm and 20 mm are obtained. A porous shell of vanadium oxide with zinc traces may have typical dimensions in a range between 10 nm and 20 nm. A shell pore size may be smaller than 10 nm. A seed layer of vanadium oxide with zinc traces may have dimensions of 20 nm.

Figure 14:
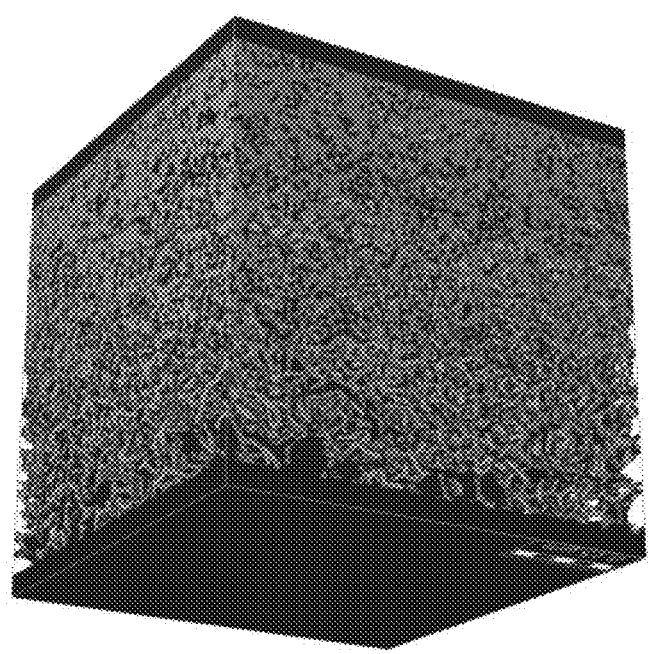
FIG. 14 illustrates a model of a porous morphological adhesion promoter according to an exemplary embodiment.
Figure 15:
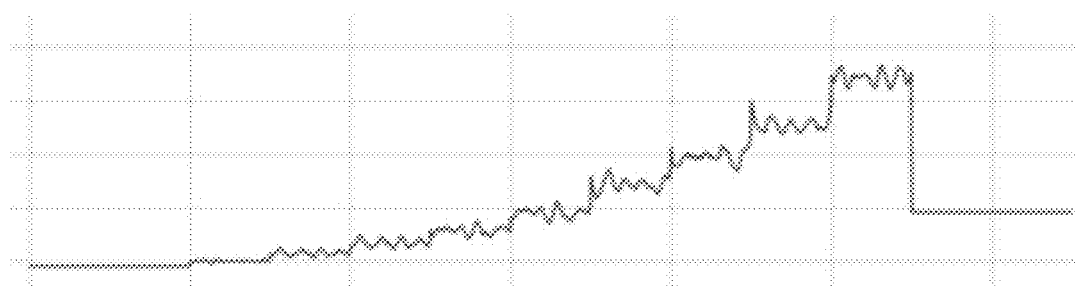
FIG. 15 is a diagram illustrating a stress mean value along the vertical direction of the porous morphological adhesion promoter according to FIG. 14.
Figure 16:
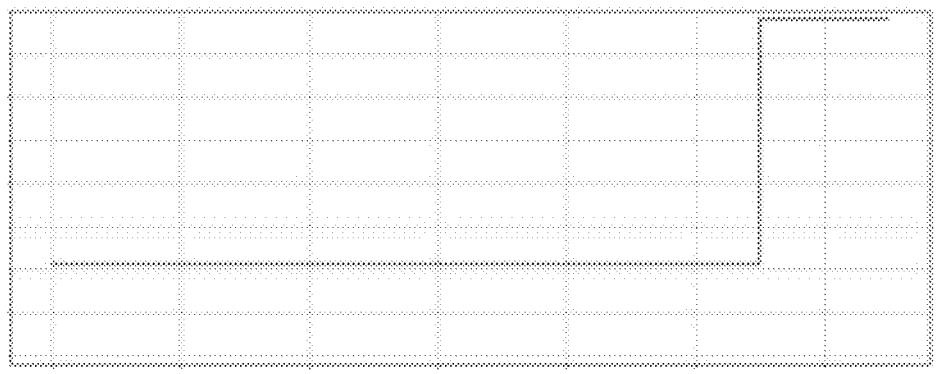
FIG. 16 is a diagram illustrating a stress mean value along the vertical direction without porous morphological adhesion promoter, for comparison with FIG. 15.

FIG. 14 illustrates a model of a porous morphological adhesion promoter 150 according to an exemplary embodiment. FIG. 15 is a diagram illustrating a stress mean value (vertical axis of the diagram) along the vertical direction (horizontal axis of the diagram) of the porous morphological adhesion promoter 150 according to FIG. 14. FIG. 16 is a diagram illustrating a stress mean value along the vertical direction without porous morphological adhesion promoter, for comparison with FIG. 15. Thus, FIG. 15 shows the stress minimized with porous adhesion promoter, and FIG. 16 is the reference of non-stress minimized without the porous adhesion promoter. FIG. 14 and FIG. 15 prove the compensation of the CTE (coefficient of thermal expansion) mismatch and the stress reduction obtained by exemplary embodiments.

The simulated morphological adhesion promoter 150 shows that the configuration of FIG. 15 may result in a stress reduction and an adaptation of the coefficient of thermal expansion. More specifically, the illustrated simulation shows that the porous morphological adhesion promoter 150 acts as stress reduction at an interface between a mold compound and an electronic component. For instance, the stress may be reduced from 0.3 GPa to about 0.1 GPa, i.e. a factor of three of stress reduction at the interface between copper and mold compound may be achieved.

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, comprising:
   an electronic component;
   an inorganic encapsulant encapsulating at least part of the electronic component; and
   an adhesion promoter that enhances adhesion between at least part of the electronic component and the encapsulant,
   wherein the adhesion promoter is a morphological adhesion promoter comprising a morphological structure having a plurality of openings.

2. The package of claim 1, wherein the encapsulant is a ceramic-based encapsulant or an inorganic polymer-based encapsulant.

3. The package of claim 1, wherein the encapsulant comprises at least one selected from the group consisting of: cement, concrete, gypsum, mortar, a silicon polymer, and an aluminum polymer.

4. The package claim 1, wherein the morphological adhesion promoter comprises at least one selected from the group consisting of: a metallic structure, an alloy structure, an alloy oxide structure, a chromium structure, a vanadium structure, a molybdenum structure, a zinc structure, a manganese structure, a cobalt structure, a nickel structure, a copper structure, a flame deposited structure, a roughened metal structure, and any alloy, alloy oxide, oxide, nitride, carbide, and selenide of said structures.

5. The package claim 1, wherein the plurality of openings comprises at least one selected from the group consisting of: pores, dendrites, and gaps between islands of a patterned structure.

6. The package of claim 1, wherein a material of the adhesion promoter is adapted for at least partially compensating a mismatch between the coefficients of thermal expansion of a material of the electronic component and a material of the encapsulant.

7. The package of claim 1, wherein the adhesion promoter forms an interlayer in an interface region between the encapsulant and the electronic component.

8. The package of claim 7, wherein at least one of:
   the interlayer provides a transition of porosity between the encapsulant and the electronic component;
   at least part of pores of the interlayer are at least partially filled with material of the encapsulant; and
   the interlayer has a thickness in a range between 30 nm and 500 nm.

9. The package of claim 1, further comprising a carrier on which the electronic component is mounted, wherein the carrier is at least partially encapsulated in the encapsulant, and wherein the carrier is at least partially covered by an adhesion promoter.

10. The package of claim 9, further comprising an electrically conductive contact element electrically coupling the electronic component with the carrier, wherein the electrically conductive contact element is at least partially encapsulated in the encapsulant, and wherein the electrically conductive contact element is at least partially covered by an adhesion promoter.

11. The package of claim 1, wherein the electronic component comprises at least one selected from the group consisting of: a semiconductor chip, a power semiconductor chip, an active electronic device, a passive electronic device, a sensor, an actuator, and a microelectromechanical system.

12. The package of claim 9, wherein the carrier is a leadframe made of copper.

13. The package of claim 10, wherein the electrically conductive contact element is a bond wire.

14. The package of claim 1, wherein the electronic component is a semiconductor chip having a metal pad.

15. The package of claim 14, wherein the metal pad is an aluminum or copper pad.

16. The package of claim 14, wherein along a vertical direction perpendicular to the metal pad, a coefficient of thermal expansion of the package is dominated by the encapsulant at a first vertical level, dominated by the metal pad at a second level, and dominated by the adhesion promoter at a third level between the first level and the second level.

17. The package of claim 14, wherein along a vertical direction perpendicular to the metal pad, an amount of material provided by the encapsulant continuously decreases and an amount of material provided by the adhesion promoter continuously increases between a first vertical level and a second vertical level, the second vertical level being closer to the metal pad than the first vertical level.

* * * * *